United States Patent
Lüpke et al.

(10) Patent No.: US 6,268,718 B1
(45) Date of Patent: Jul. 31, 2001

(54) BURN-IN TEST DEVICE

(75) Inventors: Jens Lüpke, München; Frank Weber, Kraiburg/Inn; Joseph Sillup, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/401,390

(22) Filed: Sep. 22, 1999

(30) Foreign Application Priority Data

Sep. 22, 1998 (DE) .................................. 198 43 435

(51) Int. Cl.[7] .................................................. G01R 31/28
(52) U.S. Cl. .................... 324/158.1; 324/760; 361/735
(58) Field of Search .................................. 324/754, 760, 324/158.1, 755, 758; 361/735; 365/52

(56) References Cited

U.S. PATENT DOCUMENTS

| 4,587,481 | * | 5/1986 | Lischke et al. | ......................... 324/73 |
| 5,497,079 | * | 3/1996 | Yamada et al. | .................... 324/158.1 |
| 5,680,342 | * | 10/1997 | Frankeny | ................................. 365/65 |
| 5,923,181 | * | 7/1999 | Beilstein | ................................. 324/758 |
| 5,949,242 | * | 9/1999 | Wood et al. | .......................... 324/760 |
| 6,111,756 | * | 8/2000 | Moresco | ................................. 361/735 |

FOREIGN PATENT DOCUMENTS

4226048C2    7/1996  (DE) .
196 10 123C1 10/1997 (DE) .

* cited by examiner

Primary Examiner—Safet Metjahic
Assistant Examiner—Jimmy Nguyen
(74) Attorney, Agent, or Firm—Herbert L. Lerner; Laurence A. Greenberg; Werner H. Stemer

(57) ABSTRACT

The burn-in test device has a multiplicity of test receptacles (101, 102, 103, 104 . . . ) in a test board for receiving semiconductor memories. The test board is wired alternately in such a way that burn-in pulses can be applied to the semiconductor modules in dependence on its organization, with the result that the burn-in pulses are applied in each case to the total number of input/output lines.

2 Claims, 7 Drawing Sheets

FIG. 3B

| | | | | | | | | |
|---|---|---|---|---|---|---|---|---|
| VDD | VDD | VDD | 1 | 54 | VSS | VSS | VSS | |
| DQ0 | DQ0 | NC | 2 | 53 | NC | 007 | 0015 | |
| VDDQ | VDDQ | VDDQ | 3 | 52 | VSSQ | VSSQ | VSSQ | |
| 001 | NC | NC | 4 | 51 | NC | NC | 0014 | |
| 002 | 001 | 000 | 5 | 50 | 003 | 006 | 0013 | |
| VSSQ | VSSQ | VSSQ | 6 | 49 | VDDQ | VDDQ | VDDQ | |
| 003 | NC | NC | 7 | 48 | NC | NC | 0012 | |
| 004 | 002 | NC | 8 | 47 | NC | 005 | 0011 | |
| VDDQ | VDDQ | VDDQ | 9 | 46 | VSSQ | VSSQ | VSSQ | |
| 005 | NC | NC | 10 | 45 | NC | NC | 0010 | |
| 006 | 003 | 001 | 11 | 44 | 002 | 004 | 009 | |
| VSSQ | VSSQ | VSSQ | 12 | 43 | VDDQ | VDDQ | VDDQ | |
| 007 | NC | NC | 13 | 42 | NC | NC | 008 | 102 |
| VDD | VDD | VDD | 14 | 41 | VSS | VSS | VSS | |
| LDQM | NC | NC | 15 | 40 | Vref.NC | Vref.NC | Vref.NC *) | x16 |
| WE | WE | WE | 16 | 39 | DQM | DQM | UDQM | |
| CAS | CAS | CAS | 17 | 38 | CLK | CLK | CLK | |
| RAS | RAS | RAS | 18 | 37 | CKE | CKE | CKE | |
| CS | CS | CS | 19 | 36 | NC | NC | NC | |
| BA0 | BA0 | BA0 | 20 | 35 | A11 | A11 | A11 | |
| BA1 | BA1 | BA1 | 21 | 34 | A9 | A9 | A9 | |
| A10 | A10 | A10 | 22 | 33 | A8 | A8 | A8 | |
| A0 | A0 | A0 | 23 | 32 | A7 | A7 | A7 | |
| A1 | A1 | A1 | 24 | 31 | A6 | A6 | A6 | |
| A2 | A2 | A2 | 25 | 30 | A5 | A5 | A5 | |
| A3 | A3 | A3 | 26 | 29 | A4 | A4 | A4 | |
| VDD | VDD | VDD | 27 | 28 | VSS | VSS | VSS | |

| | | | | | | | | |
|---|---|---|---|---|---|---|---|---|
| VDD | VDD | VDD | 1 | 54 | VSS | VSS | VSS | |
| DQ0 | DQ0 | NC | 2 | 53 | NC | 007 | 0015 | |
| VDDQ | VDDQ | VDDQ | 3 | 52 | VSSQ | VSSQ | VSSQ | |
| 001 | NC | NC | 4 | 51 | NC | NC | 0014 | |
| 002 | 001 | 000 | 5 | 50 | 003 | 006 | 0013 | |
| VSSQ | VSSQ | VSSQ | 6 | 49 | VDDQ | VDDQ | VDDQ | |
| 003 | NC | NC | 7 | 48 | NC | NC | 0012 | |
| 004 | 002 | NC | 8 | 47 | NC | 005 | 0011 | |
| VDDQ | VDDQ | VDDQ | 9 | 46 | VSSQ | VSSQ | VSSQ | |
| 005 | NC | NC | 10 | 45 | NC | NC | 0010 | |
| 006 | 003 | 001 | 11 | 44 | 002 | 004 | 009 | |
| VSSQ | VSSQ | VSSQ | 12 | 43 | VDDQ | VDDQ | VDDQ | |
| 007 | NC | NC | 13 | 42 | NC | NC | 008 | 104 |
| VDD | VDD | VDD | 14 | 41 | VSS | VSS | VSS | |
| LDQM | NC | NC | 15 | 40 | Vref.NC | Vref.NC | Vref.NC *) | x16 |
| WE | WE | WE | 16 | 39 | DQM | DQM | UDQM | |
| CAS | CAS | CAS | 17 | 38 | CLK | CLK | CLK | |
| RAS | RAS | RAS | 18 | 37 | CKE | CKE | CKE | |
| CS | CS | CS | 19 | 36 | NC | NC | NC | |
| BA0 | BA0 | BA0 | 20 | 35 | A11 | A11 | A11 | |
| BA1 | BA1 | BA1 | 21 | 34 | A9 | A9 | A9 | |
| A10 | A10 | A10 | 22 | 33 | A8 | A8 | A8 | |
| A0 | A0 | A0 | 23 | 32 | A7 | A7 | A7 | |
| A1 | A1 | A1 | 24 | 31 | A6 | A6 | A6 | |
| A2 | A2 | A2 | 25 | 30 | A5 | A5 | A5 | |
| A3 | A3 | A3 | 26 | 29 | A4 | A4 | A4 | |
| VDD | VDD | VDD | 27 | 28 | VSS | VSS | VSS | |

FIG. 4B

| | | | | | | | |
|---|---|---|---|---|---|---|---|
| VDD | VDD | VDD | 1 | 54 | VSS | VSS | VSS |
| DQ0 | DQ0 | NC | 2 | 53 | NC | DQ7 | DQ15 |
| VDDQ | VDDQ | VDDQ | 3 | 52 | VSSQ | VSSQ | VSSQ |
| DQ1 | NC | NC | 4 | 51 | NC | NC | DQ14 |
| DQ2 | DQ1 | DQ0 | 5 | 50 | DQ3 | DQ6 | DQ13 |
| VSSQ | VSSQ | VSSQ | 6 | 49 | VDDQ | VDDQ | VDDQ |
| DQ3 | NC | NC | 7 | 48 | NC | NC | DQ12 |
| DQ4 | DQ2 | NC | 8 | 47 | NC | DQ5 | DQ11 |
| VDDQ | VDDQ | VDDQ | 9 | 46 | VSSQ | VSSQ | VSSQ |
| DQ5 | NC | NC | 10 | 45 | NC | NC | DQ10 |
| DQ6 | DQ3 | DQ1 | 11 | 44 | DQ2 | DQ4 | DQ9 |
| VSSQ | VSSQ | VSSQ | 12 | 43 | VDDQ | VDDQ | VDDQ |
| DQ7 | NC | NC | 13 | 42 | NC | NC | DQ8 |
| VDD | VDD | VDD | 14 | 41 | VSS | VSS | VSS |
| LDQM | NC | NC | 15 | 40 | Vref.NC | Vref.NC | Vref.NC *) |
| WE | WE | WE | 16 | 39 | DQM | DQM | UDQM |
| CAS | CAS | CAS | 17 | 38 | CLK | CLK | CLK |
| RAS | RAS | RAS | 18 | 37 | CKE | CKE | CKE |
| CS | CS | CS | 19 | 36 | NC | NC | NC |
| BA0 | BA0 | BA0 | 20 | 35 | A11 | A11 | A11 |
| BA1 | BA1 | BA1 | 21 | 34 | A9 | A9 | A9 |
| A10 | A10 | A10 | 22 | 33 | A8 | A8 | A8 |
| A0 | A0 | A0 | 23 | 32 | A7 | A7 | A7 |
| A1 | A1 | A1 | 24 | 31 | A6 | A6 | A6 |
| A2 | A2 | A2 | 25 | 30 | A5 | A5 | A5 |
| A3 | A3 | A3 | 26 | 29 | A4 | A4 | A4 |
| VDD | VDD | VDD | 27 | 28 | VSS | VSS | VSS |

| | | | | | | | |
|---|---|---|---|---|---|---|---|
| VDD | VDD | VDD | 1 | 54 | VSS | VSS | VSS |
| DQ0 | DQ0 | NC | 2 | 53 | NC | DQ7 | DQ15 |
| VDDQ | VDDQ | VDDQ | 3 | 52 | VSSQ | VSSQ | VSSQ |
| DQ1 | NC | NC | 4 | 51 | NC | NC | DQ14 |
| DQ2 | DQ1 | DQ0 | 5 | 50 | DQ3 | DQ6 | DQ13 |
| VSSQ | VSSQ | VSSQ | 6 | 49 | VDDQ | VDDQ | VDDQ |
| DQ3 | NC | NC | 7 | 48 | NC | NC | DQ12 |
| DQ4 | DQ2 | NC | 8 | 47 | NC | DQ5 | DQ11 |
| VDDQ | VDDQ | VDDQ | 9 | 46 | VSSQ | VSSQ | VSSQ |
| DQ5 | NC | NC | 10 | 45 | NC | NC | DQ10 |
| DQ6 | DQ3 | DQ1 | 11 | 44 | DQ2 | DQ4 | DQ9 |
| VSSQ | VSSQ | VSSQ | 12 | 43 | VDDQ | VDDQ | VDDQ |
| DQ7 | NC | NC | 13 | 42 | NC | NC | DQ8 |
| VDD | VDD | VDD | 14 | 41 | VSS | VSS | VSS |
| LDQM | NC | NC | 15 | 40 | Vref.NC | Vref.NC | Vref.NC *) |
| WE | WE | WE | 16 | 39 | DQM | DQM | UDQM |
| CAS | CAS | CAS | 17 | 38 | CLK | CLK | CLK |
| RAS | RAS | RAS | 18 | 37 | CKE | CKE | CKE |
| CS | CS | CS | 19 | 36 | NC | NC | NC |
| BA0 | BA0 | BA0 | 20 | 35 | A11 | A11 | A11 |
| BA1 | BA1 | BA1 | 21 | 34 | A9 | A9 | A9 |
| A10 | A10 | A10 | 22 | 33 | A8 | A8 | A8 |
| A0 | A0 | A0 | 23 | 32 | A7 | A7 | A7 |
| A1 | A1 | A1 | 24 | 31 | A6 | A6 | A6 |
| A2 | A2 | A2 | 25 | 30 | A5 | A5 | A5 |
| A3 | A3 | A3 | 26 | 29 | A4 | A4 | A4 |
| VDD | VDD | VDD | 27 | 28 | VSS | VSS | VSS |

FIG. 4C

| | | | | | | | |
|---|---|---|---|---|---|---|---|
| VDD | VDD | VDD | 1 | 54 | VSS | VSS | VSS |
| DQ0 | DQ0 | NC | 2 | 53 | NC | 007 | 0015 |
| VDDQ | VDDQ | VDDQ | 3 | 52 | VSSQ | VSSQ | VSSQ |
| 001 | NC | NC | 4 | 51 | NC | NC | 0014 |
| 002 | 001 | 000 | 5 | 50 | 003 | 006 | 0013 |
| VSSQ | VSSQ | VSSQ | 6 | 49 | VDDQ | VDDQ | VDDQ |
| 003 | NC | NC | 7 | 48 | NC | NC | 0012 |
| 004 | 002 | NC | 8 | 47 | NC | 005 | 0011 |
| VDDQ | VDDQ | VDDQ | 9 | 46 | VSSQ | VSSQ | VSSQ |
| 005 | NC | NC | 10 | 45 | NC | NC | 0010 |
| 006 | 003 | 001 | 11 | 44 | 002 | 004 | 009 |
| VSSQ | VSSQ | VSSQ | 12 | 43 | VDDQ | VDDQ | VDDQ |
| 007 | NC | NC | 13 | 42 | NC | NC | 008 |
| VDD | VDD | VDD | 14 | 41 | VSS | VSS | VSS |
| LOQM | NC | NC | 15 | 40 | Vref.NC | Vref.NC | Vref.NC *) |
| WE | WE | WE | 16 | 39 | DQM | DQM | UDQM |
| CAS | CAS | CAS | 17 | 38 | CLK | CLK | CLK |
| RAS | RAS | RAS | 18 | 37 | CKE | CKE | CKE |
| CS | CS | CS | 19 | 36 | NC | NC | NC |
| BA0 | BA0 | BA0 | 20 | 35 | A11 | A11 | A11 |
| BA1 | BA1 | BA1 | 21 | 34 | A9 | A9 | A9 |
| A10 | A10 | A10 | 22 | 33 | A8 | A8 | A8 |
| A0 | A0 | A0 | 23 | 32 | A7 | A7 | A7 |
| A1 | A1 | A1 | 24 | 31 | A6 | A6 | A6 |
| A2 | A2 | A2 | 25 | 30 | A5 | A5 | A5 |
| A3 | A3 | A3 | 26 | 29 | A4 | A4 | A4 |
| VDD | VDD | VDD | 27 | 28 | VSS | VSS | VSS | though the claimed invention is not limited to the preferred embodiment shown.

BURN-IN TEST DEVICE

BACKGROUND OF THE INVENTION

FIELD OF THE INVENTION

The invention lies in the semiconductor technology field. More specifically, the present invention relates to a burn-in test device for semiconductor memories, having a test board ("test field"), in which there are provided a multiplicity of test receptacles for receiving at least one semiconductor module each. It is thereby possible for burn-in pulses to be applied to each semiconductor module and for each semiconductor module to be switched off via a separate terminal.

Burn-in tests are carried out in order to sort out and reject poor semiconductor modules before the latter are incorporated into circuits. Burn-in pulses or signals are thereby applied to the inputs of the semiconductor modules under harder operating conditions than occur during normal operation of the semiconductor module. In other words, the burn-in tests are carried out under higher temperatures than the normal temperatures for the semiconductor modules and with higher operating voltages than the normal operating voltages.

Burn-in tests are preferably performed on semiconductor memories. There exist, as is known, memories with different layout organizations, such as, for example, 64M DRAMs with the organizations 4M×16, 8M×8 and 16M×4. The terms "×16," "×8" and "×4" denote the number of input/output terminals, "DQ0, DQ1, DQ2, . . . " of the respective DRAM. "4M, ""8M" and "16M" specify the respective storage capacity. A "4M×16" DRAM thus has 16 input terminals to be tested.

The procedure heretofore, then, has been such that different test boards are used depending on the number of input terminals. In other words, a different test board is used to test a memory having the "4M×16" organization than the one used to test a semiconductor memory having the "8M×8" organization. As an alternative, it is also possible to use a test board which is suitable for semiconductor memories having the highest organization. In that case, however, the utilization of the connection capacity is reduced in the case of semiconductor memories having a lower organization.

A test board has 256 receptacles, for example, which are arranged like a matrix in 16 rows and 16 columns. One module is inserted into each receptacle. In this case, the same modules with "×16" or "×8" or "×4", that is to say semiconductor memories with 16 or 8 or 4 input terminals respectively, are tested in the entire test board in each case.

In this context, input/output terminals are to be understood to mean the terminals via which the cell array is accessed. These terminals (data pins) are designated as "DQ", as has already been indicated above. Other signals are also applied to a semiconductor memory, such as, for example, supply voltage VDD, ground voltage VSS, signals CDQM, $\overline{WE}$, $\overline{RAS}$, $\overline{CS}$, $\overline{CAS}$, addresses A1, A2, . . . , addresses WA, control signals LDQM, UDQM, DQM, CLK, CKE etc., the individual semiconductor memories—to enable them to be fitted into the same housing—also having not connected ("NC") pins leading outwards.

FIG. 4 illustrates the layout and operation of a prior art burn-in test device for universal application. Four semiconductor memories are shown here, each of which has 54 pins to which the above-mentioned signals or addresses, etc. are applied. Depending on the organization "16M×4", "8M×8" and "4M×16", respectively 4 or 8 or 16 input/output terminals DQ0, DQ1, DQ2, . . . are present. In this case, a semiconductor module having a lower organization has input/output terminals at the locations or pins at which an input/output terminal of a semiconductor memory having a higher organization is also present. For example, pin 5 is an input/output terminal for all organizations, whereas pin 2 is an input/output terminal only for the "×8" and "×16" organizations. Pin 13 is an input/output terminal only for the "×16" organization.

In the case of these prior art burn-in devices, then, the procedure is such that each input line is contact-connected independently of the organization of the memory to be tested at each receptacle at the same pin, as is shown for pin "5" in FIG. 4. In other words, in the entire board, all for example 256 receptacles are in this case contact-connected at the pin 5 via the same input line. If a semiconductor memory with the "×8" or "×4" organization is inserted into a test board which is designed for the "×16" organization, this leads to doubling or quadrupling of the test time for the former organizations. This is because if a semiconductor memory with the "×4" organization is inserted into a receptacle of a test board having the "×16" organization, test signals that are not utilized are likewise present at the "NC" terminals. Since the memory having a "×4" organization is four times larger than the memory having an "×16" organization, the test time is quadrupled.

This disadvantageous quadrupling of the test time has been circumvented heretofore only by keeping a separate test board in store for each organization, that is to say separate test boards for "×16", "×8" and "×4" organizations.

SUMMARY OF THE INVENTION

It is accordingly an object of the invention to provide a burn-in test device into whose test board or into whose receptacle semiconductor modules having different organizations can be inserted, which overcomes the above-mentioned disadvantages of the heretofore-known devices and methods of this general type and which avoids multiplication of the test time during the testing of semiconductor modules having a lower organization.

With the foregoing and other objects in view there is provided, in accordance with the invention, a burn-in test device for semiconductor components of different organizations i.e., higher organization and lower organization) and having input/output pins. The novel test device comprises:

a test board provided with a multiplicity of test receptacles for receiving at least one semiconductor module each, enabling burn-in pulses to be applied to each semiconductor module and each semiconductor module to be switched off via a separate terminal;

the test board being alternately wired for the semiconductor modules of mutually different organizations to be inserted into the test receptacles, whereby each semiconductor module having a higher organization has a pin of an input/output line to be tested at a location of a pin of an input/output line to be tested of a semiconductor module having a lower organization and a semiconductor module having the higher organization is provided at least one input/output line more than a semiconductor module having the lower organization; and wherein the burn-in pulses are applied to the respective semiconductor module in dependence on the organization of the respective semiconductor module, such that all of the input/output lines receive the burn-in pulses.

In other words, the above-noted prior art burn-in test device is altered by wiring the semiconductor modules that can be inserted into the test receptacles alternately in the test board with the result that semiconductor modules having a different but intrinsically respectively identical organization (i.e., only "×16" or only "×4") can be inserted into the test board. Given this organization, each semiconductor module having a lower organization has a pin of an input/output line to be tested at the location of a pin of an input/output line to be tested of a semiconductor module having a higher organization and a semiconductor module having a higher organization has at least one input/output line to be tested more than a semiconductor module having a low organization. Furthermore, the burn-in pulses can be applied to the semiconductor module in dependence on the organization. As a result, the burn-in pulses are applied to the total number of input/output lines.

In accordance with a concomitant feature of the invention, the input/output lines are wired alternately with a period $$m=1+M/n,$$

where M denotes a largest organization width and n denotes a smallest organization width. The largest organization width may be, for example, "×16" and the smallest organization width may be, for example "×4". The numerical examples M=16 and n=4 result, for the above example with "×4", "×8" and "×16" organizations, in m=5. In other words, every fifth semiconductor memory is connected to the same pin in each case in the test receptacles in the test board. In other words, in each case four modules are wired in a specific way, the resulting quad pattern being repeated, so that the fifth module is wired identically to the first.

As a result of this wiring principle, it is possible always to utilize the total number of input/output lines—adapted to the respective organization—during the burn-in test for all possible organizations and thus to minimize the test time. What is essential to the invention then, is the alternating wiring of the semiconductor modules in the test board of the burn-in test device instead of the identical wiring in each case at the same pin that has been customary (see FIG. 4).

Other features which are considered as characteristic for the invention are set forth in the appended claims.

Although the invention is illustrated and described herein as embodied in a burn-in test device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical reference numerals are used throughout the figures to identify identical or functionally equivalent structural arts.

DESCRIPTION OF THE PREFERRED EMBODIMENT

Figure 1:
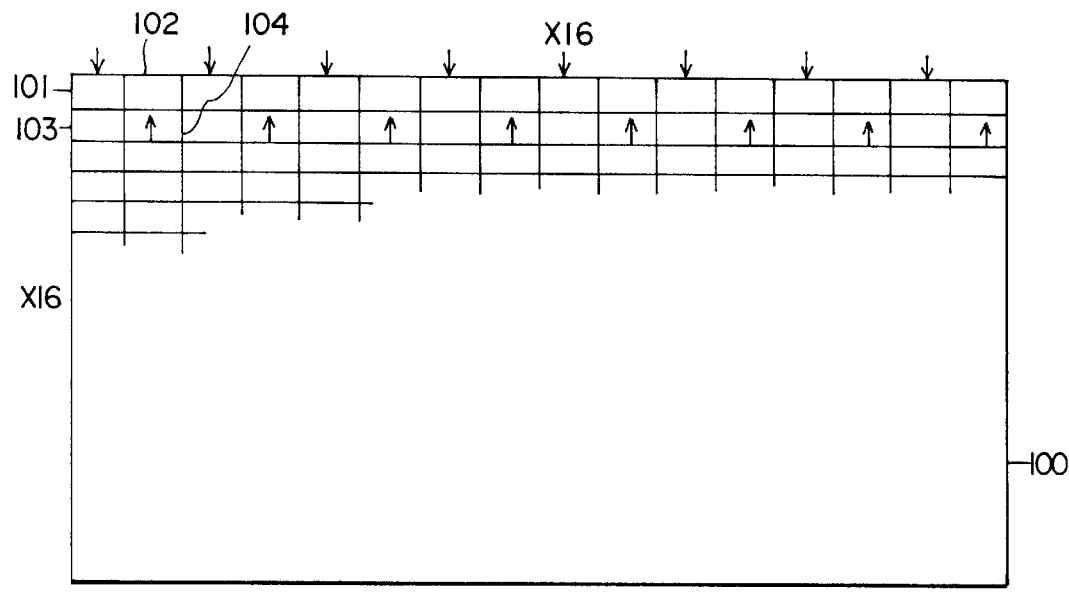
FIG. 1 is a diagrammatic illustration of a test board of the burn-in test device according to the invention.

Referring now to the figures of the drawing in detail and first, particularly, to FIG. 1 thereof, there is seen a schematic of a test board 100, in which 16 ×16 =256 test receptacles are arranged in a matrix, four test receptacles 101, 102, 103 and 104 of which are separately provided with reference symbols. A semiconductor module, in particular a semiconductor memory, is inserted in each of these test receptacles, with the result that a total of 256 semiconductor modules can be subjected to a burn-in test.

Unless otherwise noted, it will be assumed below that the semiconductor modules to be tested are those of the "×16" organization.

In a first measurement cycle, a test signal is applied for example to every other semiconductor module in the first row, while the remaining semiconductor modules in this first row are then subjected to a second test cycle, as is indicated in FIG. 1 by an upper row of arrows for the first test cycle and by a lower row of arrows for the second test cycle of the semiconductor modules in this first row, beginning with the test receptacle 101. In this way, all 256 semiconductor modules can be tested or measured in 32 test cycles.

Figure 2:
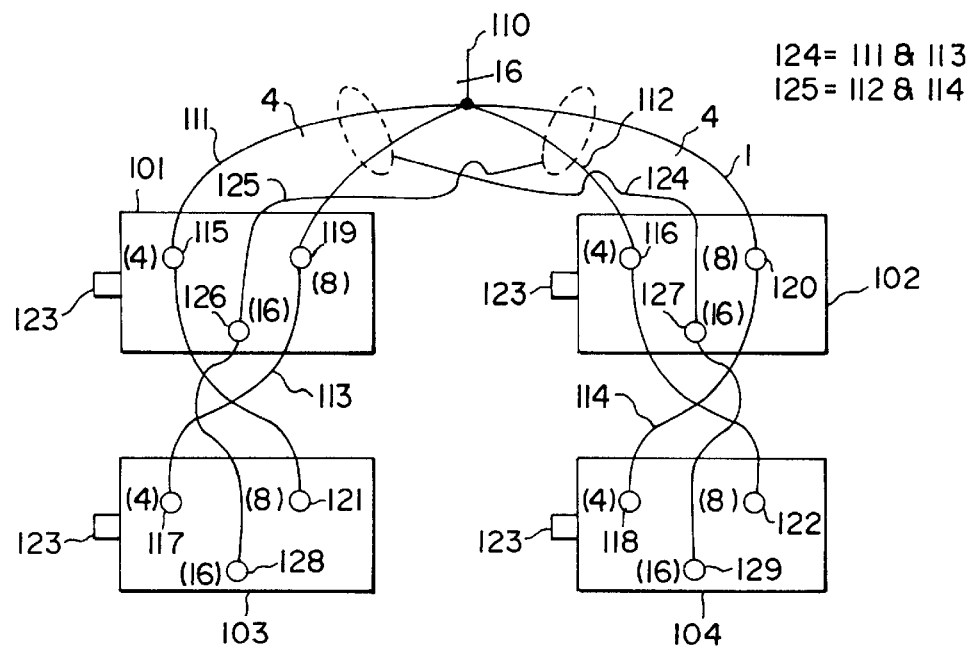
FIG. 2 is a wiring schematic of four test receptacles in the board of FIG. 1.

FIG. 2 then schematically shows the wiring of the first four test receptacles 101, 102, 103 and 104 in the test board 100. In this case, 16 input lines 110 are firstly branched into in each case 4×4 lines 111, 112, 113, 114 which lead to terminals 115, 116, 117 and 118 for pins of a semiconductor memory having a "×4"(or "×8" or "×16") organization. If, therefore, the semiconductor memories have a "×4" organization, it is possible for 32 semiconductor modules to be tested simultaneously with one test cycle. The result is that the semiconductor modules of the entire test board 100 can be tested with 8 test cycles.

In order to enable testing of semiconductor modules having a "×8" organization, the lines 111 are routed as far as the test receptacle 103 and the lines 112 extend as far as the test receptacle 104. In a similar manner, in the case of the lines 113, 114, terminals are also provided for the test receptacles 101 and 102. Terminals 119, 120, 121 and 122 are thus provided for pins of semiconductor modules having a "×8" organization. Since the lines 111, 112, 113 and 114 lead to in each case two terminals (for example 115 and 121 for the line 11), during a test of the semiconductor modules of the first row, the semiconductor modules of the second row, that is to say the semiconductor modules in the test receptacles 103 and 104, are switched off, and this can be done by applying a signal DQM="1" to separate terminals 123. By applying this signal "1" to the respective terminals 123, it is thus possible to switch off the respective semiconductor modules in the corresponding test receptacles, thereby ensuring that only one semiconductor module has a test signal applied to it by a respective line 111, 112, 113 and 114. Sixteen (16) semiconductor modules can thus be tested simultaneously with one test cycle. The result is that all the semiconductor modules of the entire test board 100 are tested with 16 test cycles.

In order to test semiconductor modules having a "×16" organization, eight additional lines are in each case necessary as well for each test receptacle. For this purpose, the lines 111, 113 of the test receptacles 101, 103 are branched to the test receptacles 102, 104 by lines 124. Conversely, the lines 112, 118 of the test receptacles 102, 104 are branched into lines 125 for the test receptacles 101, 103. Terminals 126, 127, 128, 129 are thus produced for pins of semiconductor modules having a "×16" organization.

The line 111 must not be connected ("NC") to the test receptacles 103, 102, 104 for example in the case of the "×4" organization and must not be connected ("NC") to the test receptacles 102, 104 in the case of the "×8" organization.

Figures 3, 3A:
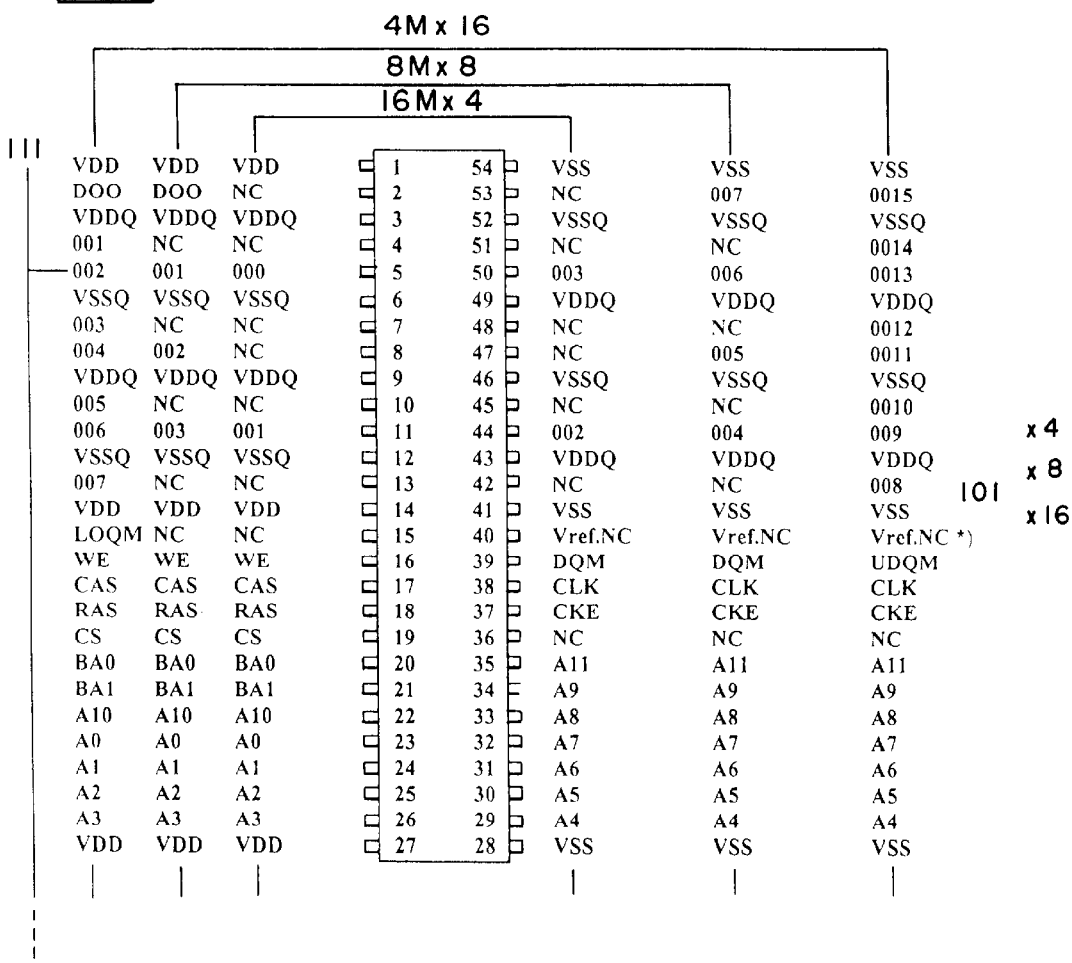
FIG. 3 is a wiring chart of four 64M semiconductor memories in the burn-in test device according to the invention.
Figure 3C:
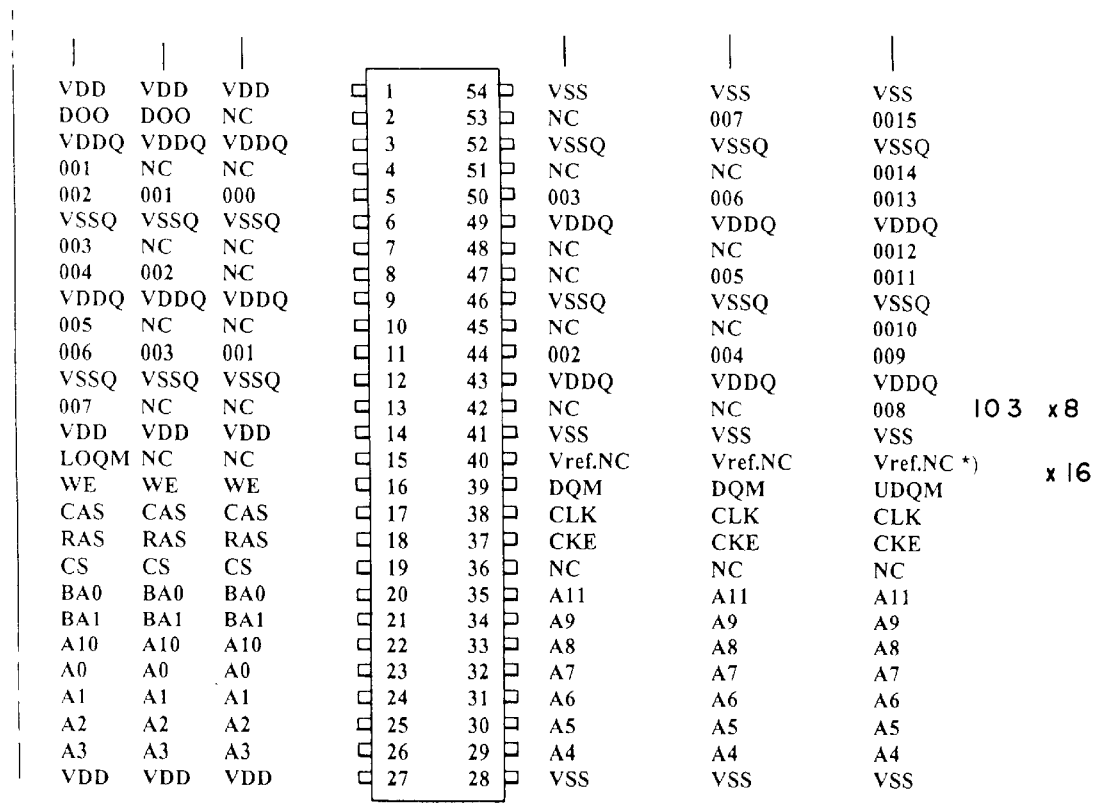
Figures 4, 4A:
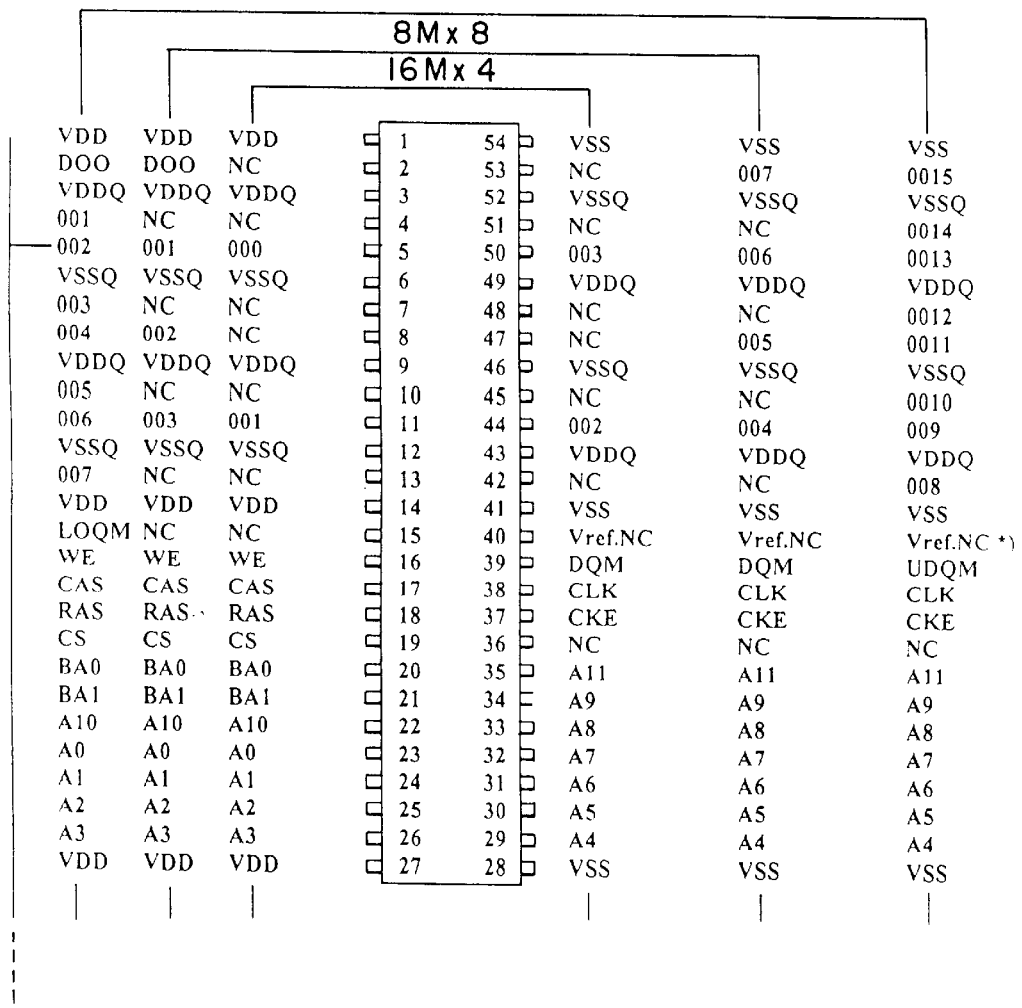
FIG. 4 is a wiring chart of four 64M semiconductor memories in a prior art burn-in test device.

FIG. 3 illustrates the semiconductor modules in the receptacles 101, 102, 104 and 103 from top to bottom with their respective terminals. A comparison with FIG. 4 immediately shows that here, in contrast to the input line making contact with the pins identically, alternate wiring of the semiconductor modules on the burn-in board is present which enables test pulses to be applied only to those pins of the semiconductor modules which are actually connected to an input/output line ("DQ"). This enables the test time to be considerably reduced, it being possible for semiconductor modules having a different organization to be inserted into the individual test receptacles 101, 102, 103, 104, etc., of a test board.

We claim:

1. A burn-in test device for semiconductor components of different organizations including a higher organization and a lower organization, and the semiconductor components having input/output pins, the test device comprising:

a test board provided with a multiplicity of test receptacles for receiving at least one semiconductor module each, enabling burn-in pulses to be applied to each semiconductor module and each semiconductor module to be switched off via a separate terminal;

said test board being alternately wired for the semiconductor modules of mutually different organizations to be inserted into said test receptacles, wherein each semiconductor module having a higher organization has a pin of an input/output line at a location of a pin of an input/output line of a semiconductor module having a lower organization and the semiconductor module having the higher organization is provided at least one input/output line more than the semiconductor module having the lower organization; and wherein the burn-in pulses are applied to the respective semiconductor module in dependence on the organization of the respective semiconductor module, such that all of the input/output lines receive the burn-in pulses.

2. The burn-in test device according to claim 1, wherein the input/output lines are wired alternately with a period $$m = 1 + M/n,$$

where M denotes a largest organization width and n denotes a smallest organization width.

* * * * *